United States Patent [19]

Dunaway et al.

[11] Patent Number: 5,498,900

[45] Date of Patent: Mar. 12, 1996

[54] SEMICONDUCTOR PACKAGE WITH WELDABLE CERAMIC LID

[75] Inventors: Thomas J. Dunaway, New Hope; Richard K. Spielberger, Maple Grove, both of Minn.

[73] Assignee: Honeywell Inc., Minneapolis, Minn.

[21] Appl. No.: 171,958

[22] Filed: Dec. 22, 1993

[51] Int. Cl.⁶ .................................................. H01L 23/552
[52] U.S. Cl. ......................... 257/659; 257/660; 257/704; 257/710
[58] Field of Search ................................... 257/704, 659, 257/660, 710

[56] References Cited

U.S. PATENT DOCUMENTS 4,626,960  12/1986  Hamano et al. ...................... 257/704
4,827,082  5/1989  Horiuchi et al. ......................... 257/703

*Primary Examiner*—William Mintel
*Assistant Examiner*—Roy Potter
*Attorney, Agent, or Firm*—Gregory A. Bruns

[57] ABSTRACT

An integrated circuit package for use in radiation environments includes a base and a lid of insulative materials. The base has a recess for receiving a die and a seal ring located on the periphery. The lid has a central insulation portion and an outwardly extending flange which can be welded to the seal ring.

4 Claims, 1 Drawing Sheet

U.S. Patent  Mar. 12, 1996  5,498,900
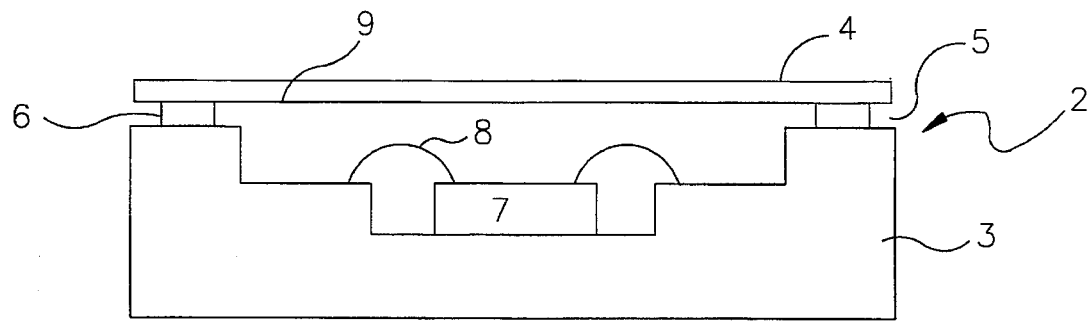
Prior Art  Fig.1
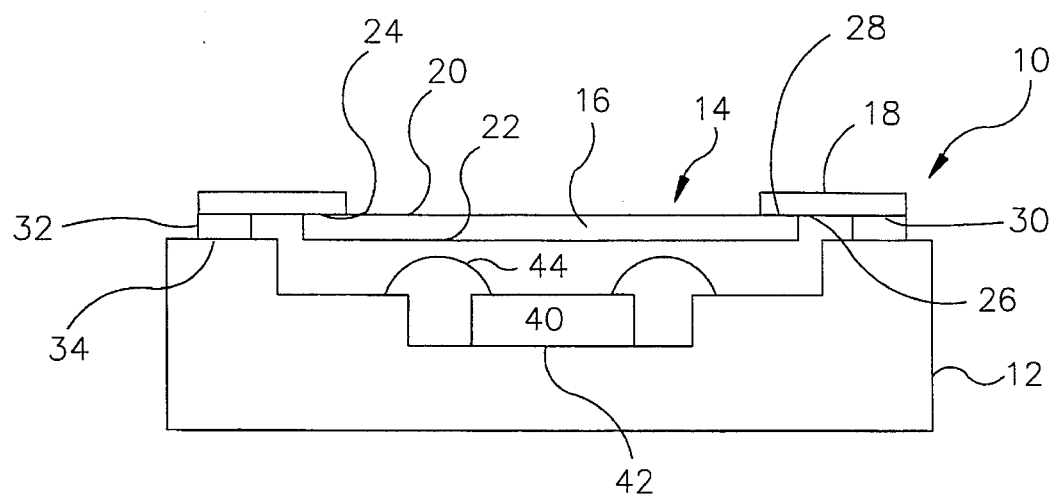
Fig.2

SEMICONDUCTOR PACKAGE WITH WELDABLE CERAMIC LID

BACKGROUND OF THE INVENTION

The present invention relates generally to integrated circuit (IC) packaging and specifically to IC packaging which provides a hermetic seal and reduces dose enhancement from secondary electrons.

In the design of IC packaging that will be used in radiation environments, attention must be given to designing the package so as to protect the circuits from damage due to radiation. Spacecraft or satellites traveling in typical earth orbits are exposed to a natural space radiation environment including gamma rays, x-rays and other high energy particles. Electrons and x-rays are the principal contributors to total dose radiation problems within a spacecraft or satellite. The type of interactions that occur between photons and the atoms in a bombarded or exposed material depends on the atomic number of the target material. X-rays become absorbed by a targeted atom and the atom emits an electron. For atoms having a high atomic number, such as gold, it is easier to liberate an electron than it is for atoms having a low atomic number.

The lid or cover of an IC package has an underside which is typically located near and facing the active region of the IC chip. Package lids are typically made of nickel/iron or kovar that has been nickel and gold plated. During package assembly the lid is typically brazed to the package with a gold/tin eutectic solder. Unfortunately the gold plated surface of the underside of the lid is facing the integrated circuit which will be a generator for electrons when the package is exposed to x-rays and other radiation. The active region of the chip is located near the top surface of the chip, and it is the dose in the active region which affects IC performance. The gold surface of the underside of the lid when bombarded with high energy particles liberates electrons to the chip surface. This electron showering of the integrated circuit can affect performance.

Ceramic lids do not contribute to total dose and a ceramic lid is sometimes used in lieu of the gold plated kovar lid previously described. The ceramic package would typically have a ceramic lid secured by means of solder through a solder reflow process. It is known that in radiation environments severe enough to produce thermal mechanical shock (TMS) to components, metal lid solders can melt and spatter over the IC die causing failure.

Thus a need exists for a package that does not contribute to total dose and can withstand TMS.

SUMMARY OF THE INVENTION

The present invention solves these and other needs by providing an integrated circuit package having a base of an insulative material with a recessed portion for receiving a die and a peripheral portion having a metal seal ring. A lid has a central portion of a insulative material and an outwardly extending metal flange secured to the central portion. After a die is die bonded and wire bonded in the base, the metal flange can be welded to the metal seal ring.

BRIEF DESCRIPTION OF THE DRAWINGS

FIG. 1 is a cross section of a ceramic package of the type found in the prior art.

FIG. 2 is a cross section of a ceramic package in accordance with the present invention.

DETAILED DESCRIPTION

A typical package for an integrated circuit is illustrated in FIG. 1. Package 2 includes base 3, lid 4, and kovar seal ring 5. Seal ring 5 is attached to base 3 by brazing at 6. Base 3 would typically be of ceramic material, lid 4 would typically be of nickel and gold plated kovar, and seal ring 5 would be kovar. Integrated circuit die 7 rests on base 3 and has wire bonds 8 which extend from die 7 to internal conductors (not shown) within package 2. Surface 9 of lid 4 is gold plated and when subjected to radiation emits electrons which shower die 7 and affect performance.

An integrated circuit package 10 in accordance with the present invention is shown in the drawings and generally designated 10.

Package 10 includes base 12, typically of ceramic and lid 14. Die 40 rests on surface 42 of base 12 and has wire bonds 44 which extend from die 40 to internal conductors (not shown) within base 12 which are connected to leads or pins (also not shown). Lid 14 includes a central portion 16 having a periphery 17 secured to a flange 18. Central portion 16 is preferably made of a ceramic material and include upper surface 20, lower surface 22 and periphery 24. Flange 18 has a lower surface 26 which includes an inner portion 28 and an outer portion 30. Flange 18 is made from a metallic material and is preferably kovar or alloy 42. Lower surface inner portion 28 is brazed to periphery 17 of central portion 16 of lid 14. The brazing may be done by known means, using, for example a copper silver eutectic.

Package 10 further includes seal ring 32 preferably made of kovar. Seal ring 32 rests on and is brazed to surface 34 of base 12. Lid 14 can then be secured to seal ring 32 by welding. For example, parallel seam welding where package 10 including base 12, seal ring 32 and lid 14 are passed under electrode wheels which are in contact with flange 18 to effect a weld.

Now that the construction of package 10 has been set forth, many advantages may be described and appreciated. With die 40 located in package 10 and lid 14 in place it is clear that ceramic portion 16 of lid 14 is located directly above the active circuit portion of die 40. This is in contrast to the package arrangement of FIG. 1 where kovar lid 4 with nickel and gold plating is located directly above die 7. When high energy particles bombard the gold plated surface of lid 4, electrons are released which in turn bombard die 7. The nickel and gold plating thus contribute to dose enhancement while the ceramic lid of the present invention does not contribute to dose enhancement.

In addition, the higher temperature processes used in brazing seal ring 32 to base 34 and in brazing flange 18 to ceramic portion 16 of lid 14 are completed prior to locating die 40 in package 10. The only package welding operation after die placement is the parallel beam welding of flange 18 to seal ring 32 which is a room temperature operation. Thus the present invention does not subject die 40 to higher temperature processes.

Also it is known that severe radiation environments that produce thermomechanical shock can melt the solders used to attach kovar lids. The melted solder can spatter on the die and cause failure. The present invention provides a ceramic lid that can be welded to a package. A welded ceramic lid is not subject to melting of solder and does not contribute to dose. Thus Applicants have developed an integrated circuit package that can be used to limit secondary electron emission due to absorbed radiation and can withstand TMS. It is not intended that coverage be limited to the disclosed embodiments, but only by the terms of the following claims.

We claim:

1. An integrated circuit package for use in radiation environments comprising:

a base formed from an electrically insulative material, said base having a recessed central portion for receiving an integrated circuit die and a peripheral portion;

a metal seal ring secured to said peripheral portion of said base;

a central lid portion formed from an electrically insulative material, said central lid portion having a periphery;

an outwardly extending metal flange secured to said periphery portion of said central lid portion, said flange for complementary receipt on said metal seal ring with said flange and said seal ring connected by a solder-free welded bond.

2. Circuit package of claim 1 wherein said base and said lid are formed of a ceramic material and said metal seal ring and said metal flange are kovar.

3. An integrated circuit package for use in radiation environments comprising:

a ceramic base having a central area for receiving a die and a perimeter surface area;

a metal seal ring secured to said perimeter surface area;

a lid having a central ceramic portion and an outwardly extending metal flange secured to said ceramic portion, said metal flange resting on said metal seal ring and connected to said metal seal ring by a solder-free welded bond.

4. Integrated circuit package of claim 3 wherein said metal flange and said seal ring are kovar.

* * * * *